United States Patent [19]

Ward et al.

[11] Patent Number: 4,687,940
[45] Date of Patent: Aug. 18, 1987

[54] HYBRID FOCUSED-FLOOD ION BEAM SYSTEM AND METHOD

[75] Inventors: J. William Ward, Canoga Park; John L. Bartelt, Thousand Oaks; Robert L. Seliger, Agoura, all of Calif.; Charles M. McKenna, Boxford, Mass.

[73] Assignee: Hughes Aircraft Company, Los Angeles, Calif.

[21] Appl. No.: 842,103

[22] Filed: Mar. 20, 1986

[51] Int. Cl.[4] .......................................... H01J 37/317
[52] U.S. Cl. ................................ 250/492.2; 250/398
[58] Field of Search ........... 250/492.21, 492.2, 492.22, 250/492.23, 492.3, 398, 396 R; 313/361.1; 219/121 ER, 121 ES, 121 ET

[56] References Cited

U.S. PATENT DOCUMENTS 3,117,022  1/1964  Bronson et al. ............... 250/492.21
4,263,514  4/1981  Reeds ............................. 250/492.2

Primary Examiner—Bruce C. Anderson
Assistant Examiner—Jack I. Berman
Attorney, Agent, or Firm—Wanda K. Denson-Low; A. W. Karambelas

[57] ABSTRACT

An ion beam microfabrication system is described which is capable of operating in either a flooded beam mode, in which a relatively high current beam is used to yield a rapid throughput, or in a low current, high resolution focused ion beam mode. With a focused beam a small, relatively low current ion spot is deflected in a predetermined pattern over a portion of the wafer to produce more detailed patterning that is not achievable in the flooded beam mode. A lens is added to the beam column to modify the beam collimation between the focused and flooded modes, and switching between modes is accomplished by simply actuating or de-actuating the lens. The beam is formed with a larger acceptance angle and total current in the flooded than the focused mode.

23 Claims, 8 Drawing Figures

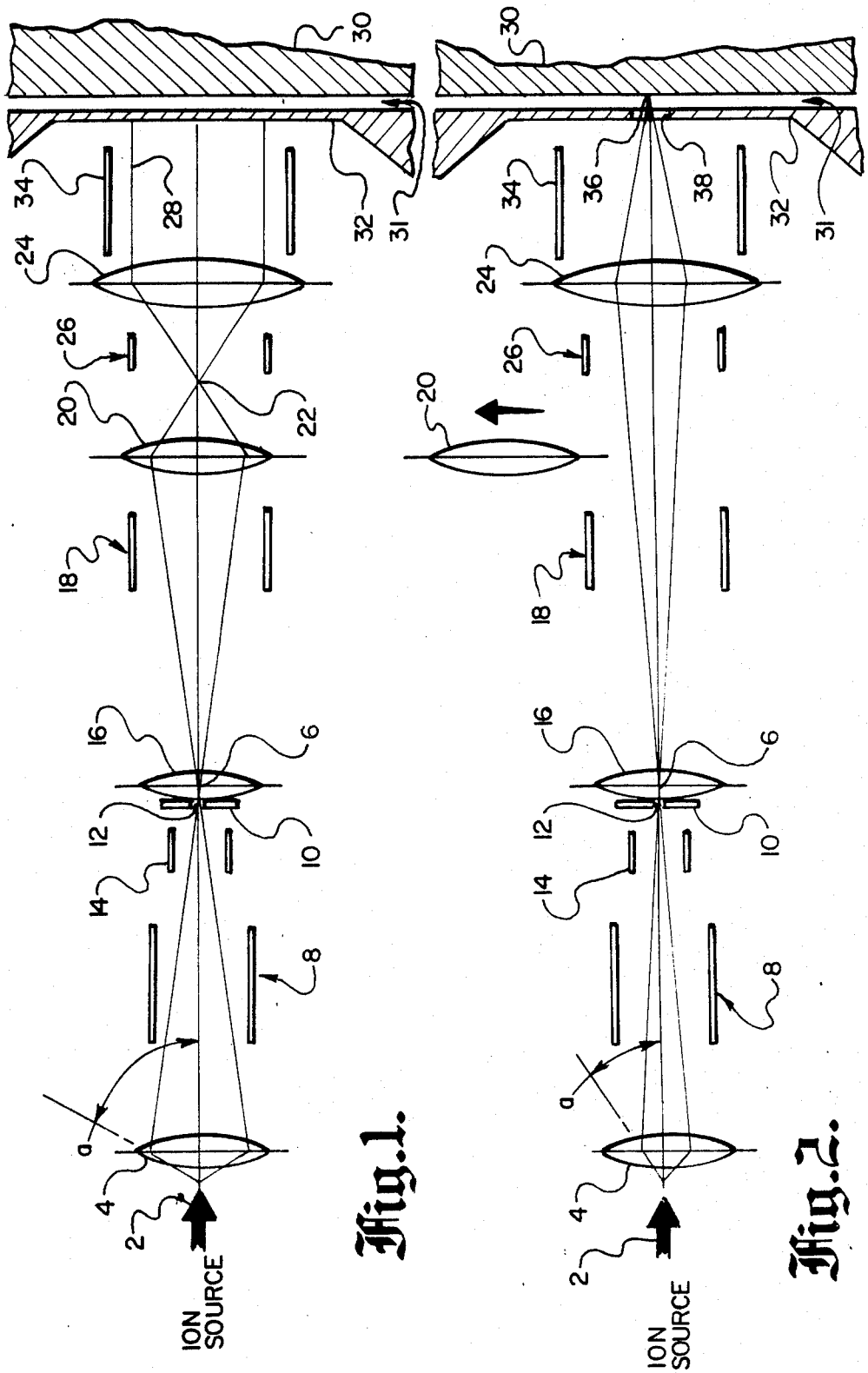

HYBRID FOCUSED-FLOOD ION BEAM SYSTEM AND METHOD

The United States Government has rights in this invention pursuant to Contract No. N66001-82-C-0288, issued by the Department of the Navy.

BACKGROUND OF THE INVENTION

1. Field of the Invention

This invention relates to the fabrication of integrated circuits with ion beams, and more particularly to direct-write ion beam lithography in which ion implantation is accomplished by focusing an ion beam onto a small spot on a semiconductor substrate and deflecting the beam over the substrate to implant desired patterns, and to systems in which a mask is flooded with ions to form a pattern beam which implants desired regions on an underlying substrate.

2. Description of the Prior Art

Two advanced approaches can be taken to ion implantation which eliminate the use of conventional photolithography and any wafer contacting masks to define the regions to be implanted. The first approach, which may be termed the "flooded" mode of operation, produces a higher throughput of semiconductor wafers with corresponding cost efficiencies and rapid turn-around time. In the flooded mode a mask bearing a circuit pattern is placed in close proximity to, but not touching, a semiconductor wafer upon which a circuit is to be fabricated. A "proximity" mask of this type is to be distinguished from a more conventional "contact" mask, in which a mask is provided directly on the wafer in the form of a pattern of resist or other ion blocking film. The proximity mask is then flooded with a relatively large cross-section ion beam. The mask transmits selected portions of the beam for ion implantation on the underlying substrate, and blocks other potions of the beam. Although this technique is relatively efficient, it is not as flexible as might be desired when it comes to providing particular doping patterns on the wafer. For example, graded doping patterns are desirable when forming the base region of a bipolar transistor. The base contact is heavily doped, whereas the active base region is lightly doped. It is desirable to have a gradual, non-abrupt transition between the doping levels of these two areas. Flooded beam fabrication, however, results in a uniform doping level over those areas of the wafer exposed to the beam, and this us not adaptable to varying the doping level over small portions of the wafer. There are a number of other situations in which a more detailed doping pattern than that generally available with a flooded beam are desirable. In addition, some problems have been encountered in properly aligning the wafer with the mask and beam. One effective technique involves the use of laser beams directed at gratings on the mask and wafer to achieve the desired alignment. However, laser beams represent an entirely different type of radiation, and are difficult to incorporate as part of an ion beam system.

The other lithography approach uses focused ion beams, with the beam reduced to a small spot and deflected over the wafer in an appropriate pattern until a desired doping has been achieved. One such focused beam system that is capable of producing a high resolution, high energy scanning spot is described in co-pending U.S. patent application Ser. No. 482,745, filed Apr. 7, 1983 by J. William Ward et al., entitled "Focused Ion Beam Microfabriation Column" and assigned to the assignee of the present invention. In this system an ion beam emerging from a source is focused to a first cross-over in the vicinity of a mass separator, which removes undesired particles from the beam. A first accelerating lens is also positioned in the vicinity of the first beam cross-over to accelerate the beam, while a final accelerating lens is positioned to further accelerate and focus the beam to a small spot on the substrate. A deflector downstream of the final accelerating lens causes the focused beam to follow the desired pattern on the wafer. The energy imparted to the beam by the accelerating lenses is variable, thus permitting the lenses to function as a control over the beam's total energy and depth of implantation.

The focused beam approach permits a higher degree of flexibility in providing detailed implantation patterns on the wafer. However, since the size of the focused beam spot on the wafer is much smaller than the area emcompassed by a flooded beam without a corresponding increase in the current density of the focused beam, it takes much longer to expose a given area on the wafer with a focused beam than with a flooded beam. This greatly reduces the wafer throughput, with a corresponding increase in the cost and time required to produce each individual wafer.

SUMMARY OF THE INVENTION

In view of the above problems associated with the prior art, the object of the present invention is the provision of a novel and improved system and method of ion beam lithography that operates at the relatively high production rates associated with flooded beam proximity mask production, and yet is capable of the more detailed circuit patterns associated with direct-write focused ion beams.

Another object is the provision of such a system and method which is capable of operating in either a focused or flooded beam mode and of rapidly and conveniently switching between the two modes.

Yet another object is the provision of such a system and method which also has the capacity to align a mask with an underlying semiconductor substrate without the need for extraneous alignment apparatus such as a laser beam system.

In the accomplishment of these and other objects of the invention, a focused ion beam lithographic system is provided with a special mechanism that, when actuated, converts the system to a flooded mode of operation. The system can be cycled back and forth between its focused and flooded modes by the simple operation of a switch, without the need for any substitution of equipment or movement of the wafer undergoing fabrication. A single wafer can be fabricated in its entirety in either the focused or flooded modes, or the majority of the wafer can be rapidly fabricated in the flooded mode with more detailed doping taking place with a focused beam. The focused mode can also be used to locate alignment marks on the substrate to align the substrate with a mask, followed by fabrication in the flooded and/or focused modes.

In a preferred embodiment, a system as provided which includes a means for supporting a semiconductor substrate, an ion beam source, a focusing lens that is positioned to focus the ion beam emerging from the source to a first crossover, a mass separator positioned to remove undesired particles from the beam, a first accelerating lens positioned in the vicinity of the first beam crossover to accelerate the beam, a final accelerating lens positioned to further accelerate and focus the beam to a small spot on the substrate in a desired pattern. A control lens is added to the system and positioned between the first and final accelerating lenses to focus the beam to a second crossover in the vicinity of the final accelerating lens focal point, thereby causing the final accelerating lens to substantially flood a portion of the mask and underlying substrate. The control lens is capable of being switched between actuated and de-actuated states; when de-actuated it passes the ion beam to the final accelerating lens without substantial change, thereby permitting the final accelerating lens to focus the beam to a small spot on the substate. A switch is provided for selectively switching the control lens between its actuated and de-actuated states, depending upon whether focused or flooded beam operation is desired, and a mask is positioned over the substrate for flooded mode operation. The mask may include openings to permit focused beam patterning of specific substrate portions, with the remainder of the substrate fabricated with a flooded beam. When operated in the flooded beam mode, the beam is formed with a greater total current than in the focused beam mode, yielding a high flooded beam throughput. The increased current is preferably achieved by means of a greater cone angle of acceptance from the beam source.

Other features and advantages of the invention will be apparent to those skilled in the art from the following detailed description of a pereferred embodiment, taken together with the accompanying drawings, in which:

DESCRIPTION OF THE DRAWINGS

FIG. 1 is a ray diagram illustrating the processing of an ion beam for flooded beam operation in accordance with the invention, with the beam's angular convergence and divergence at various points greatly exaggerated;

FIG. 2 is a ray diagram similar to FIG. 1, showing the system operating in a focused beam mode;

DETAILED DESCRIPTION OF A PREFERRED EMBODIMENT

Figure 3:
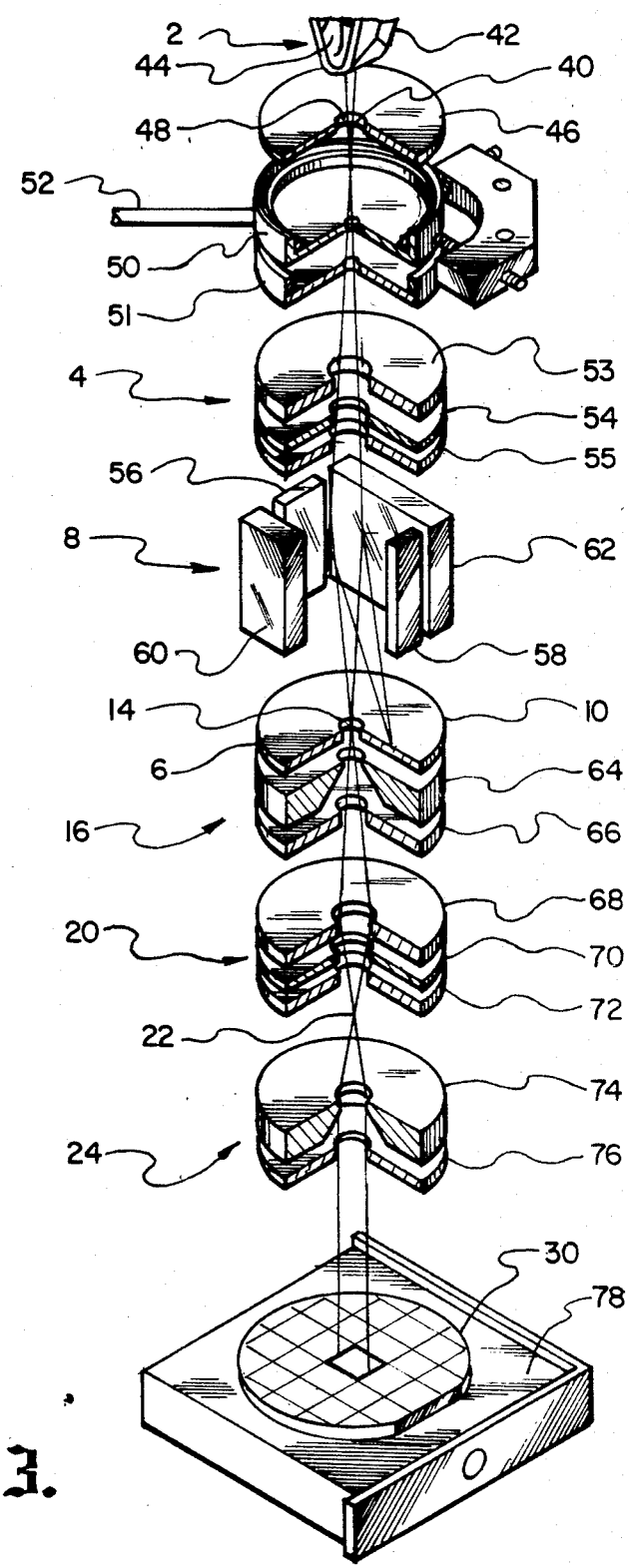
FIG. 3 is a quadrature sectioned view showing the beam forming and shaping elements of the ion beam column.

The basic elements of an ion beam microfabrication system constructed in accordance with the invention are shown in FIG. 1. A charged particle beam source 2 is provided which produces a beam of charged particles that appear to emanate from a very small point. Beam source 2 is preferably of the liquid metal point source variety, in which ions are provided from a heated liquid metal which flows onto a sharp point, where the metal is ionized in an electric field. The gallium arsenide dopants Si and Be or the silicon dopants B and As are commonly used in eutectic alloys to produce dopant ions for use in this type of column.

A first lens, preferably a symmetric einzel lens 4, is positioned in the path of the expanding beam to focus the beam to an initial crossover 6. Einzel lens 4 is of standard construction, consisting of three electrodes with openings for the beam. Lens 4 was chosen to be an einzel lens so that it does not increase the beam energy, and thereby reduces the magnetic field required for mass separation. It is operated in the accelerating mode, in which the ions are accelerated between the first and second electrodes and then decelerated back to the input energy level between the second and third electrodes. This mode of operation has lower aberrations than the deceleraton mode, in which the ions are decelerated between the second and third electrodes.

An ExB separator 8 is positioned along the beam path downstream from focusing lens 4. This type of separator, which is well known in the art, operates with nominally orthogonal magnetic and electric fields transverse to the beam path. Since the beam is at its low extraction energy at the mass separator, and ExB separator of low magnetic and electric field strength may be used. In addition, since the beam diameter at this point is less than its diameter after it has been processed into a flooded beam, as described hereinafter, the small beam diameter again reduces aberrations as compared to that suffered by a larger beam. Mass separator 8 includes an aperture plate 10 with a central separator opening 12. The desired ion species is directed through opening 12, while heavier or lighter ions are deflected to one side or the other of the opening and blocked by the plate 10. A set of beam steering electrodes 14 are provided prior to the plate to properly direct the beam.

An initial accelerating lens 16, preferably implemented as a Munro lens, is positioned immediately downstream from the separator plate 10, in the vicinity of the beam crossover 6. As described in co-pending application Ser. No. 482,745, the voltage differential across accelerating lens 16 can be varied so as to control the energy of the beam particles along the entire column.

After passing another set of beam steering electrodes 18 which ensure that the beam is on axis, the beam is focused by a second einzel lens 20 to a second crossover 22. Lens 20 acts as a mode control for the system, as described further hereinafter. When it is actuated by the application of an electric potential to its middle electrode, the beam is processed by the remainder of the column into a relatively large diameter collimated beam that floods a mask and underlying semiconductor wafer, thus enabling rapid circuit fabrication. In the absence of an applied potential at its middle electrode, lens 20 is de-actuated and does not substantially effect the beam's collimation. In this event the beam is formed at a downstream location into a finely focused spot that can be used for detailed implantation or mask/wafer alignment.

A final accelerating Munro lens 24 is positioned downstream from control lens 20, with a third set of beam steering electrodes 26 positioned between the last two lenses. Final accelerating lens 24 is configured and positioned such that its focal point is located approximately at beam crossover 22, so that the beam as it emerges from the crossover appears to be emanating from the focal point of lens 24. This in turn causes the beam as it emerges from lens 24 to be substantially collimated with a relatively large cross-sectional area. The collimated beam, identified by reference numberal 28, is of sufficient size and current capacity fo the column to operate in a flooded beam mode, irradiating a large portion of a semiconductor substrate at one time for rapid throughput. With a nominal diameter of 1 mm., the flooded beam is considerably larger than the minimum feature size to be formed on the wafer.

The column includes a support mechanism to hold a semiconductor wafer 30 in alignment with the flooded beam 28. The wafer is separated by a small gap 31 from a mask 32 upon which a circuit pattern is inscribed, and which is positioned before the wafer in the beam path. Finally, a set of x/y deflectors 34, preferably implement as an octupole deflector, are provided between final accelerating lens 24 and wafer 30 to deflect the beam in a desired pattern over a portion of the wafer when operating in the system's focused, as opposed to the flooded, mode. Beam deflectors 34 are not operated in the flooded beam mode.

A unique advantage of the present invention is that it is capable of operating in either a flooded or focused beam mode with only a very simple and convenient modification necessary to switch between modes. With the flooded beam operation shown in FIG. 1, rapid wafer production is made possible because a relatively large portion of the wafer can be processed at one time by the relatively large flooded beam, as compared to a focused beam. If a more detailed doping operation is called for that cannot be handled by a flooded beam, such as grading the doping level over a small area, the system can be easily switched to a focused beam mode capable of varying the ion doping in predetermined patterns over the wafer substrate. Different portions of the wafer can be processed in the flooded and focused beam mode, or the entire wafer can be processed in either mode. Also, the column can be operated with a focused beam to accomplish initial alignment between the mask and wafer, followed by processing in either mode.

The operation of the system in the focused beam mode is illustrated in FIG. 2. Only two modifications in the processing of the beam are utilized in converting from flooded to focused beam operation. First, control lens 20 is effectively removed from the beam path, permitting the beam to continue along its path from the first accelerating lens 16 to the final accelerating lens 24 without interruption. Lens 24 is located with respect to the other column elements and wafer 30 such that the beam is focused to a small spot 36 on the wafer. While control lens 20 is illustrated in FIG. 2 as being physically moved out of the beam path, in actual practice the lens is de-actuated by merely switching off the electric potential applied to its middle electrode. When a focused beam is used in connection with a mask, an opening 38 is normally provided in the mask over the wafer area within which focused beam processing is to take place.

The second modification in converting from flooded to focused beam operation involves a reduction in the total current of the beam emanating from ion source 2 to focusing lens 4. Conventional ion sources include an extraction aperture, the size of which determines the beam's angular divergence. With a larger aperture, more ions are accepted by the aperture and the beam's angular divergence increase. Since the beam is formed essentially as a cone, its angular divergence may be referred to as the cone angle of acceptance. In the flooded beam mode the half angle (a) of the beam from source 2 is in the order of about 10 milliradians (mrad), while the corresponding half angle (a) in the focused mode is in the order of approximately 1.5 mrad. This regulation of the beam's cone angle of acceptance can be accomplished by a mechanical device which switches between a larger aperture for the flooded mode and a smaller aperture for the focused mode. A large area is desired in the flooded beam versus a focused beam are somewhat more relaxed, permitting a larger percentage of the emitted source current to be used with the flooded beam and thus decreasing the relative exposure time.

In one embodiment, the diameter of the flood beam is approximately 1mm. When compared with a typical focused beam field of about $100 \times 100$ microns, the flood beam is capable of patterning or doping an area equivalent to approximately 100 focused beam fields. Since the beam current is proportional to the square of the angular apertures, increasing the beam's angular divergence in the flooded mode produces a corresponding increase in the total beam current. For a 10 mrad flooded beam, a beam current of approximately 10 nA is achievable, as opposed to a current of approximately 0.2 nA achieved with a 1-2 mrad focused beam. With a typical dose requirement of $2 \times 10^{12}/cm^2$ over 50% of the field, the focused beam can process a $100 \times 100$ micron field in approximately 0.4–0.5 seconds. By contrast, a flooded beam with 10 nA can expose a $1 \times 1$ mm field in approximately 1.5 seconds. Adding 0.5 second for alignment and another 0.5 second for stepping time between fields, the comparable times to expose a $1 \times$ mm field are 150 seconds in the focused beam mode versus 2.5 seconds in the flooded beam mode.

In the embodiment shown in FIGS. 1 and 2, the approximate magnifications produced by each of the four lenses are as follows (demagnification is indicated by a factor of less than 1):
focusing lens 4; 5
accelerating lens 16: 1
control lens 20: 0.1 (flooded mode)
accelerating lens 24: 0.2 (infinity in flooded mode)

In the focused beam mode the described system typically produces a focused spot at the wafer surface approximately 0.25 microns in diameter, with a current of 0.2 nA. The spot is smaller than the minimum circuit feature size commonly fabricated with current technology. The system shown in FIG. 2, with the control lens 20 effectively removed, is similar to that described in co-pending application Ser. No. 482,745, assigned to the assignee of the present invention. That system, however, is limited to the focused beam mode and is incapable of the much greater exposure rates and throughputs made possible with the present system.

Referring now to FIG. 3, the physical configuration of the principal column elements is shown. Ion source 2 is provided as a high brightness source which produces a beam of charged particles that appear to emanate from a very small point. Source 2 has a very sharp point 40 which extends through the apex of a hairpin shaped heater 42. A mass of metal 44, which is the feed material for the ion supply, is placed within the hairpin and is melted by the heater. The feed metal may be either an element or an alloy containing the desired ion species. By a capillary action, the metal moves to the point 40 where it is ionized in the electric field.

An extraction electrode 46 is located immediately below the ion emitting tip, with a central beam opening 48 on the beam axis, Below the extraction plate are a pair of aperture plates 50 and 51. The upper plate 50 has a small central aperture through which only a relatively small portion of the beam can be transmitted, the remainder of the beam being blocked by the plate surrounding the aperture. The size of the aperture and the distance of the plate from the ion source determines the beam's acceptance angle, which as stated in the embodiment shown herein is approximately 1.5 mrad in the focused mode. The lower aperture plate 51 has a larger central aperture which transmits a greater portion of the beam for flooded mode operation, preferably with a half angle of about 10mrad as stated. The smaller aperture plate 50 is provided with a handle 52, by means of which the plate can be moved completely out of the beam path. With the upper plate 50 thus effectively removed, the larger aperture in plate 51 defines a beam angle suitable for operation in the flooded mode. When plate 50 is moved back into the beam path, its smaller aperture defines a beam angle suitable for operation in the focused beam mode.

Focusing lens 4 is preferably provided in the form of an einzel lens having electrodes 53, 54 and 55. Each of these three electrodes also have central beam openings on the beam axis. It is preferred that lens 4 operate in the accelerating mode, in which the ions are accelerated between electrodes 53 and 54, and then decelerated back to their input energy level between electrodes 54 and 55. Operating in the accelerating mode results in lower aberrations than would be the case if the lens were operated in a decelerating mode, although the accelerating mode requires a greater electric field strength.

ExB mass separator 8 is positioned along the beam path between focusing lens 4 and first accelerating lens 16. Electric field plates 56 and 58 are positioned facing each other on opposite sides of the beam path, as are magnetic pole pieces 60 and 62. The combined effect of the electric field plates and magnetic pole pieces is to pass the selected ion species through aperture 14 of plate 10, while deflecting heavier or lighter species onto the plate.

The first accelerating lens 16 includes a pair of electrodes 64 and 66, also with central openings along the beam axis. As shown, the beam is focused to its first crossover 6 in the vicinity of accelerating lens 16, and more precisely at about the opening 14 in mass separator aperture plate 10. Accelerating lens 16 is used to vary the beam energy. The voltage of the final accelerating lens 24 is adjusted together with the first acclerating lens voltage so that the lens voltage ratio shield nearly constant, thus maintaining control over the beam focusing as the final beam energy is varied.

The mode control lens 20 is an einzel lens similar in construction to focusing lens 4, with three electrodes 68, 70 and 72. Lens 20 is preferably operated in the decelerating mode when the system is operated towards the higher end of its voltage range, with outer electrodes 68 and 72 held at the same electrical potential as accelerating lens electrode 66 and a lower voltage applied to the middle electrode 70. At lower system voltages the lens can be operated in either the accelerating or decelerating mode. The lens is actuated for flooded mode operation merely by applying an appropriate voltage level to electrode 70, and de-actuated for focused beam operation by removing the middle electrode potential. Lens 20 is illustrated as being actuated in FIG. 3, with a beam focused to crossover 22 at the focal point of final accelerating lens 24.

Lens 24 includes electrodes 74 and 76, which apply a final accelerating voltage to the ion beam. Depending upon whether the control lens 20 has been actuated or not, lens 24 either floods a specified portion of an underlying target wafer 30, or focuses the ion beam to a small spot on the wafer (beam deflector 34 and mask 32 are not shown in FIG. 3). Wafer 30 is supported on a stage 78, which is moveable so that different areas of the wafer can be acted upon by the beam. When operating in the focused beam mode, the beam deflection and acceleration are controlled by a suitable program so that the desired pattern is traced on the wafer by the beam.

Figure 4:
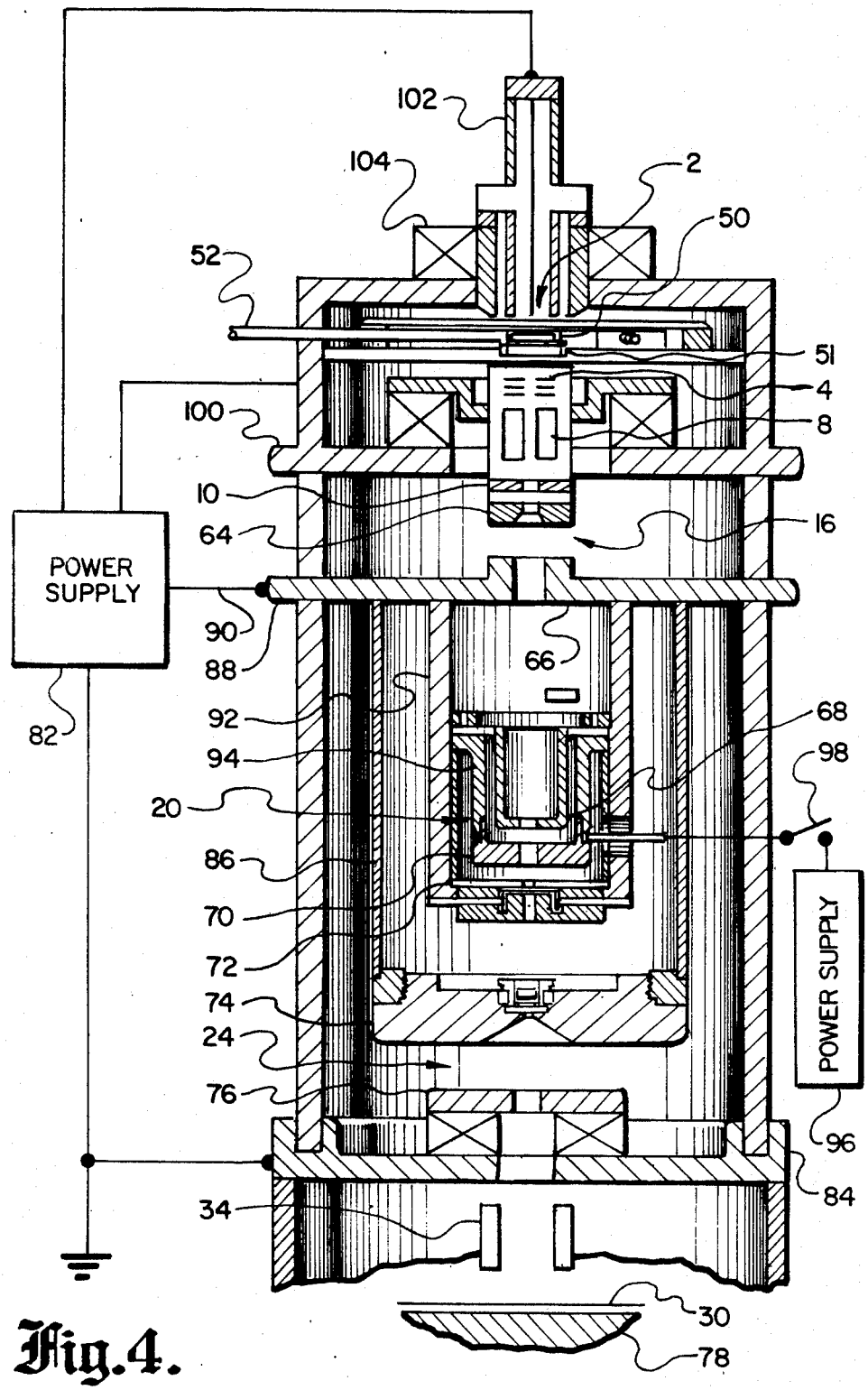
FIG. 4 is a schematic diagram of functional portions of the column, with the various column elements shown in cross-section.

The physical structure and electrical potentials applied to the column are illustrated in the schematic diagram shown in FIG. 4. The column is enclosed in a ceramic insulator tube 80 which serves as a vacuum wall so that a vacuum can be maintained within the column along the beam path. Insulator tube 80 is a cylinder with a sufficiently high insulation value that it can stand off the voltage on the vacuum side without gradient rings. Additional mechanical strength and electrical insulation may be provided as described in co-pending application Ser. No. 482,745.

The upper end of the column is maintained at a higher voltage potential than the lower end, producing a voltage gardient which accelerates the ions onto the wafer or other target. The wafer 30, stage 78, deflector 34 and downstream electrode 76 of the final accelerating lens 24 are held at ground potential or some other convenient reference level. With the lower end of the column grounded, the electronics driving the deflection circuits and the stage positioning are at a convenient potential. A power supply 82 is connected to base plate 84 to provide the ground potential.

The upstream electrode 74 of final accelerating lens 24 is electrically and mechanically connected by means of a drift tube 86 to a flange 88 on insulator tube 80, the insulator tube electrically separating the flange fromt he ground potential at base plate 84. An electric potential is applied to the flange 88, and thereby to final accelerating lesn electrode 74, over a line 90 from power supply 82. The potential applied to flange 88 is selected in accordance witht he desired amount of final acceleration, typically in the range of 30–125 kV.

Control lens 20 is mounted within drift tube 86 in an inner tube 92, which is also connected to flange 88 and is kept at the same voltage potential. Outer control lens electrodes 68 and 72 have a direct electrical connection to tube 92, and are thereby maintained at the same potential. Middle electrode 70 is mounted to tube 92 by means of an electrically insulated standoff 94. An electrical connection is made to middle elecrrode 72 from a separate power supply 96 via a control switch 98 and a suitable high voltage feedt hrough insulator bushing. Switch 98 is operated from an exterior control panel, and is used to actuate or de-actuate the control lens. It thus provides a very simple and convenient mechanism for switching the system between flooded and focused beam operation.

An upper flange 100 provides a bulkhead which is maintained at 144 kV when operated at the highest potential of the present example. Flange 100 is electrically and mechanically connected to aperture plate 10 and the upper electrode 64 of initial accelerating lens 16, and establishes the same potential for those elements. The mass separator 8 is also at the potential of upper flange 100. A second winding in the high voltage isolation transformer of power supply 82 provides the deflection voltage for mass separator electric filed plates 56 and 58. The center electrode for focusing lens 4 is supplied by a separate power supply (not shown) through a suitable high voltage feedthrough insulator bushing inthe upper flange 100.

Power supply 82 is also connected to ion source 2. In the preferred embodiment, ion source 2 is operated at a 6 kV differential from upper flange 100, for a total maximum differential of 150 kV with respect to the target wafer. The ions ource 2 is insulated form its housing by insulator tube 102 so that it can be supported on support ring 104 with respect to the top flange.

The final beam energy is controlled by changing the final lens accelerating potential between electrodes 74 and 76. The beam focusing is maintained by controlling the potential on the first accelerator lens electrodes 64 and 66 so that the beam energy out of electrode 66 is a constant fraction of the total beam energy. This control over the beam energy produces a corresponding control over the depth of implantation.

Figure 5:
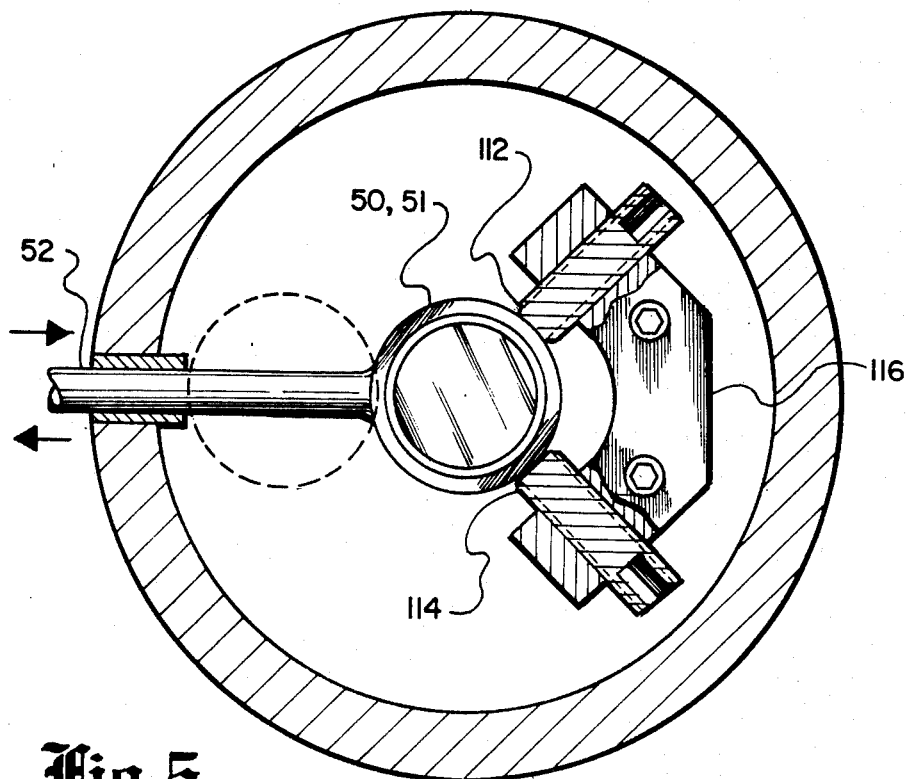
FIGS. 5 and 6 are respectively plan and elevation views showing the mechanism used to adjust the beam's angular divergence between the flooded and focused beam modes.
Figure 6:
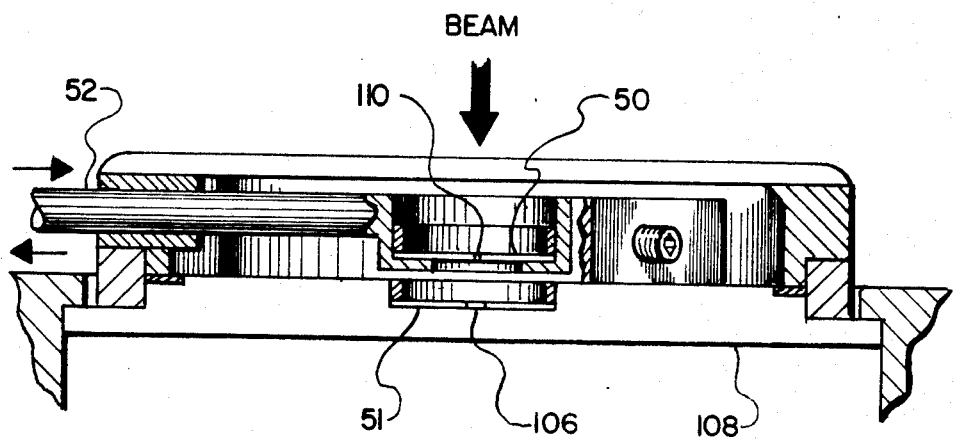

Details of one mechanism for adjusting the beam's acceptance angle are shown in FIGS. 5 and 6. The lower plate 51 has a relatively large central aperture 106, and is permanently mounted on a support flange 108. Upper plate 50 has a much smaller central aperture 110, and can be moved entirely out of the beam path by means of handle 52. A pair of stops 112, 114 are held by a support mechanism 116 to accurately position plate 50 during focused beam operation when it is placed in the beam path.

Figure 7:
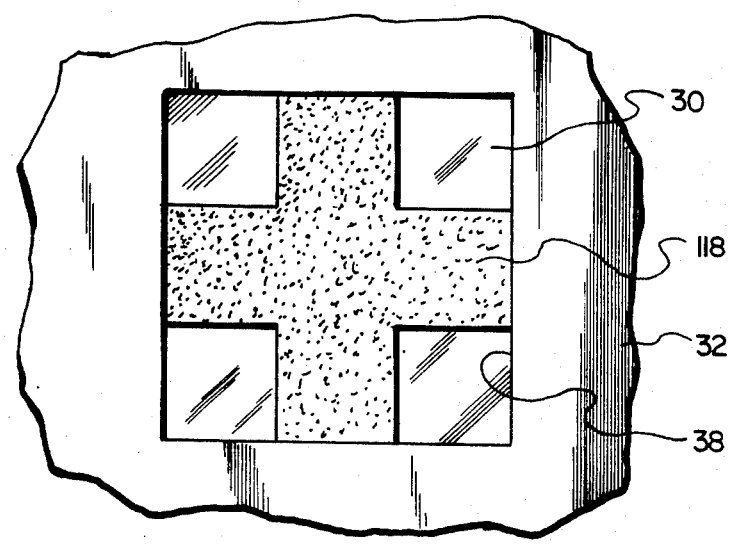
FIGS. 7 and 8 are plan views showing an opening in a pattern mask and two versions of underlying alignment marks on a semiconductor wafer, suitable for alignment in the focused beam mode of the present invention.
Figure 8:
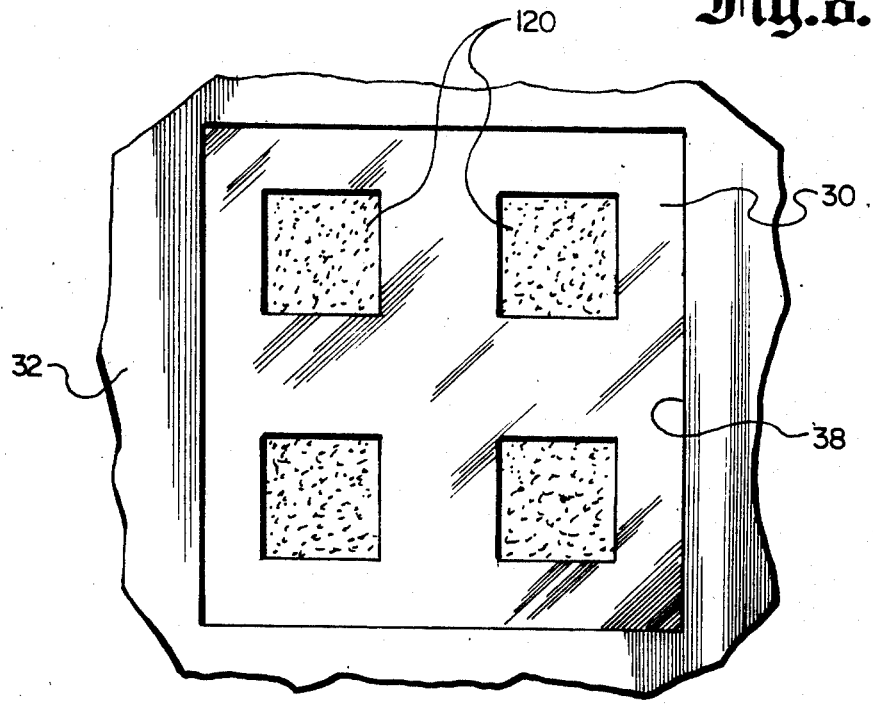

When operated in the focused beam mode, the system can be used for mask-wafer alignment as well as for implantation. FIGS. 7 and 8 illustrate two possible alignment schemes. In FIG. 7, one or more cross-shaped alignment marks 118 are provided on the upper surface of wafer 30. Mark 118 is proportioned to opening 38 in mask 32 such that it can be viewed through and aligned with the opening when the mask and wafer are in proper mutual alignment. The alignment between the mask opening and the mark is determined by scanning the focused beam over the mask opening, collecting secondary electrons that are emitted from the impact of the beam on the wafer, and modulating a cathode ray tube (CRT) which scans a screen in synchronism with the ion beam scanning. This is a conventional technique, which may employ a channeltron to collect the secondary electrons. The wafer is typically mpoved in the x,y plane until proper alignment with the mask opening is achieved, although the wafer might be held stationary and the mask adjusted.

In FIG. 8 four small alignment marks 120 are positioned on the wafer relative to each other to form a single overall mark. The overall mark is aligned with the mask opening in the same manner as in FIG. 7.

A particular embodiment of an ion beam fabrication system which is capable of much more flexible integrated circuit processing than prior systems has thus been shown and described. As numerous modifications and alternate embodiments will occur to those skilled in the art, it is intended that the invention be limited only in terms of the appended claims.

We claim:

1. In a charged particle beam microfabrication system of the type having a means for supporting a substrate upon which an elecrical circuit is to be fabricated, a charged particle beam source, means for focusing the beam to a small spot on the substrate, and means for deflecting the spot over the substrate in a desired pattern, the improvement comprising:
   means for positioning a mask in close proximity to the substrate,
   a beam modification means positioned in the beam path and having a first state altering the beam collimation so that the beam substantially floods a portion of the mask, and a second state at which the focused beam is substantially unaffected, and
   means for selectively switching said beam modification means between said first and second states, thereby enabling the system to be switched between rapid substrate processing in a flooded beam mode and detailed fabrication in a focused beam mode.

2. The microfabrication system of claim 1, further comprising means for forming the beam with a greater total current in the flooded beam mode than in the focused beam mode.

3. In a charged particle beam microfabrication system of the type having a means for supporting a substrate upon which an electrical circuit is to be fabricated, a charged particle beam source, an accelerating lens for accelerating and focusing the beam to a small spot on the substrate, and means for deflecting the spot over the substrate in a desired pattern, the improvement comprising:
   means for positioning a mask in close proximity to the substrate,
   a control lens positioned in the beam path and switchable between two states, the control lens being configured and positioned so that in the first lens state the beam is focused to the vicinity of the accelerating lens focal point, causing the accelerating lens to substantially flood a portion of the mask with the beam, and in the second lens state the beam is focused by the accelerating lens to a small spot on the substate, and
   means for selectively switching the control lens between its two states, thereby enabling switching between rapid substrate processing in a flooded beam mode and detailed fabrication in a focused beam mode.

4. The microfabrication system of claim 3, said beam source comprising an ion beam source.

5. The ion beam microfabrication system of claim 4, wherein the control lens is positioned to focus the beam directly to the vicinity of the accelerating lens focal point in the first control lens state.

6. The ion beam microfabrication system of claim 5, the control lens comprising an einzel lens, and the switching means being connected to actuate and deactuate the einzel lens in the flooded and focused beam modes, respectively.

7. The ion beam microfabrication system of claim 4, further comprising a current control means for forming the beam from the ion source with a greater total beam current in the flooded than in the focused beam mode.

8. The microfabrication system of claim 7, said current control means comprising a beam blocking means having a pair of beam transmitting apertures which are positionable in the beam path, the first aperture transmitting a greater portion of the beam with a greater total beam current than the second aperture, and means for selecting the first aperture to define the beam in the flooded mode and the second aperture to define the beam in the focused mode.

9. The microfabrication system of claim 8, the beam blocking means comprising first and second beam blocking members which are positionable next to each other in the beam path, the first and second apertures being formed in the first and second beam blocking members, respectively, the first aperture being substantially larger than the second aperture, and the aperture selecting means comprising means for positioning the second aperture and blocking member out of the beam path in the flooded mode and in the beam path in the focused mode.

10. In an ion beam microfabrication system of the type having a means for supporting a substrate upon which an electrical circuit is to be fabricated, an ion beam source, a focusing lens positioned to focus the beam emerging from the source to a first crossover, a mass separator positioned to remove undesired particles from the beam, a first accelerating lens positioned in the vicinity of the first beam crossover to accelerate the beam, a final accelerating lens positioned to further accelerate and focus the beam to a small spot on the substrate, and means for deflecting the spot over the substrate in a desired pattern, the improvement comprising:

means for positioning a mask in close proximity to the substrate, a control lens capable of being switched between actuated and de-actuated states, the control lens being positioned between the first and final accelerating lenses to focus the beam from the first accelerating lens to a second crossover in the vicinity of the final accelerating lens focal point when the control lens is actuated, thereby causing the final accelerating lens to substantially flood a portion of the mask and underlying substate, and to pass the beam to the final accelerating lens without substantial change when the control lens is de-actuated, thereby permitting the final accelerating lens to focus the beam to a small spot on the substrate, and a switch means for selectively switching the control lens between actuated and de-actuated states.

11. The microfabrication system of claim 10, the control lens comprising an einzel lens, and the switch means being connected to actuate and de-actuate the enizel lens in the flooded and focused beam modes, respectively.

12. The microfabrication system of claim 11, wherein the focusing lens is an approximately $5\times$ magnifying einzel lens, the first accelerating lens is an approximately unity$\times$Munro lens, the control lens in the flooded beam mode is approximately $0.1\times$ demagnifying einzel lens, and the final accelerating lens in the focused beam mode is an approximately $0.2\times$ demagnifying Munro lens.

13. The microfabrication system of claim 10, further comprising a current control means for forming the beam from the ion source with a greater acceptance angle in the flooded than the focused beam mode, and a correspondingly greater total beam current.

14. The microfabrication system of claim 14, wherein the beam's half acceptance angle is approximately 10 mrad in the flooded mode and no more than approximately 1.5 mrad in the focused mode.

15. A method of forming an integrated circuit, comprising the steps of:

forming an divergent ion beam, focusing the beam to a small spot on a substrate during a focused beam mode, and deflecting the focused beam over a portion of the substrate in a desired pattern, positioning a circuit pattern mask between the beam and the substrate, and altering the beam collimation during a flooded beam mode so that the beam substantailly floods at least a portion of the mask to establish a mask pattern on the underlying substrate, and selecting between the focused and flooded beam operating modes.

16. The method of claim 15, wherein the focused and flooded beam modes are selected for different portions of the same substrate.

17. The method of claim 16, for use with a substrate having alignment marks thereon, wherein the focused beam is deflected to scan the alignment marks to determine the relative position of the substrate.

18. The method of claim 16, the mask being provided with at least one opening, wherein the focused beam mode is selected for operating within said openings.

19. The method of claim 15, wherein the beam is formed with a greater total current in the flooded than in the focused beam mode.

20. The method of claim 19, wherein the beam is formed with a greater acceptance angle in the flooded than in the focused beam mode.

21. A method of forming an integrated circuit, comprising the steps of:

forming a divergent ion beam, focusing the beam to a first crossover, removing undesired particles from the beam, providing a first acceleration to the beam without substantially altering its collimation, and selecting between focused beam and flooded beam operating modes, the focused beam operating mode comprising the steps of providing a final acceleration to the beam, focusing the beam to a small spot on a substrate, and deflecting the focused beam over a portion of the substrate in a desired pattern, and the flooded beam operating mode comprising the steps of focusing the beam to a second crossover, providing a final acceleration to the beam after said scond crossover, focusing the beam after said second crossover to a substantially collimated cross-section, and positioning a circuit pattern mask betwen the collimated beam and the substrate to establish a mask pattern on the underlying substrate.

22. The method of claim 21, wherein the final acceleration is accomplished by a final accelerating lens, an einzel lens is positioned in the beam path to focus the beam to said second crossover substantially at the focal point of the final accelerating lens, and a selection is made between the focused and flooded modes by respectively de-actuating and actuating the einzel lens.

23. The method of claim 22, wherein the ion beam is formed with a substantially greater acceptance angle and a correspondingly greater total current in the flooded mode than in the focused mode.

* * * * *